(12) United States Patent
Devries et al.

(10) Patent No.: US 6,963,249 B2
(45) Date of Patent: Nov. 8, 2005

(54) INJECTION LOCKING USING DIRECT DIGITAL TUNING

(75) Inventors: Christopher Andrew Devries, Ottawa (CA); Ralph Dickson Mason, Ottawa (CA)

(73) Assignee: ENQ Semiconductor Inc., Ontario (CA)

( * ) Notice: Subject to any disclaimer, the term of this patent is extended or adjusted under 35 U.S.C. 154(b) by 65 days.

(21) Appl. No.: 10/639,543

(22) Filed: Aug. 12, 2003

(65) Prior Publication Data

US 2004/0036538 A1 Feb. 26, 2004

(30) Foreign Application Priority Data

Aug. 12, 2002  (CA) .............................................. 2395891

(51) Int. Cl.[7] .............................. H03B 5/12; H03B 28/00
(52) U.S. Cl. ..................... 331/47; 331/55; 331/117 FE; 331/158; 331/172; 331/177 V
(58) Field of Search .............................. 331/10, 16, 25, 331/34, 38 C, 53–55, 117 R, 117 FE, 117 D, 158, 172, 175, 177 V, 179, 47

(56) References Cited

U.S. PATENT DOCUMENTS 5,394,117 A  *  2/1995  Cohen ......................... 331/47
6,121,847 A  *  9/2000  Katznelson et al. .......... 331/44

FOREIGN PATENT DOCUMENTS

| CA | 2357491   | 3/2003  |
|----|-----------|---------|
| EP | 0 395 860 | 11/1990 |
| EP | 1 011 198 | 6/2000  |
| EP | 1 213 840 | 6/2002  |
| EP | 1 229 655 | 8/2002  |

OTHER PUBLICATIONS

C. Samorini et al "Phase Noise Degradation at High Oscillation Amplitudes in LC–Tuned VCO's" IEEE Journal of Solid–State Circuits; Jan., 2000; vol. 35, No. 1 pp 96–99.
Melville, R.; Long, D.et al, "An Injection Locking Scheme for Precision Quadrature Generation", European Solid State Circuits Conference (ESSCIRC) Proceedings, 2001.
Ahmed, Hesham; DeVries,Chris; "A Digitally Tuned 1.1 GHz subharmonic Injection Locked VCO in 0.18 um CMOS"; Carleton University, Ottawa, Canada.
Philips Semiconductor; "An Overview of the phase–locked loop (PLL)", pp 16, Dec. 1988.

* cited by examiner

*Primary Examiner*—David Mis
(74) *Attorney, Agent, or Firm*—Wolf, Greenfield & Sacks, P.C.

(57) ABSTRACT

The invention relates to the field of electronics and more particularly to the tuning and injection locking of voltage controlled oscillators (VCOs). An improved injection locking circuit is provided which allows the VCO to injection lock with a smaller reference signal and therefore a smaller locking bandwidth (LBW). In order to allow the VCO to injection lock with a lower power reference signal, this invention includes a pre-tuning algorithm to place the VCO frequency such that the desired frequency is in the LBW. Tuning of the VCO is achieved using direct digital tuning that does not require an input reference. Injection locking is performed using a low frequency clock harmonic as the reference signal. More specifically, tuning is accomplished by sub-sampling and digitizing the output signal of the VCO, determining the center frequency, and adjusting the VCO control voltage.

27 Claims, 4 Drawing Sheets

INJECTION LOCKING USING DIRECT DIGITAL TUNING

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever

BACKGROUND TO THE INVENTION

1. Field of Invention

The invention relates to the field of electronics and more particularly to the tuning and injection locking of voltage controlled oscillators (VCOs).

2. Description of the Related Prior Art

As will be understood by those skilled in the art, an oscillator is an electronic device used for the purpose of generating a signal. Oscillators are found in computers, audio-frequency equipment, particularly music synthesizers, and wireless receivers and transmitters. There are many types of oscillator devices, but they all operate according to the same basic principle: an oscillator always employs a sensitive amplifier whose output is fed back to the input in phase. Thus, the signal regenerates and sustains itself. This is known as positive feedback.

As will be also understood by those skilled in the art, some oscillators employ combinations of inductors, resistors, and/or capacitors to generate their operating frequency such as resistor-capacitor (RC) and inductor-capacitor (LC) oscillators. However, the best stability (constancy of frequency) is obtained in oscillators that use quartz crystals. When a direct current is applied to such a crystal, it vibrates at a frequency that depends on its thickness, and on the manner in which it is cut from the original mineral rock.

A voltage-controlled oscillator (VCO) is a circuit that generates an oscillating signal at a frequency proportional to an externally applied voltage. VCOs are often found in phase-locked loops (PLLs) used for, among other things, synchronizing an oscillation frequency to an external reference, or to a higher multiple or derivative of a crystal reference. In the first case (called clock recovery) the goal is to recreate a clock signal synchronous to that which was used to generate a data stream. In the second case, the goal is to generate a higher frequency signal that has the phase noise properties of a low frequency reference. The phase noise of a VCO is generally very poor and does not meet the need of many applications. It is also unpredictable in terms of it's nominal frequency and drift. The crystal on the other hand is much more exact and has better phase noise. To generate a high radio frequency (RF) using a lower frequency crystal oscillator as a reference, a PLL is used.

FIG. 1 depicts a block diagram of a frequency tuning circuit including a PLL with VCO circuit. The circuit consists of an oscillator 20 or external reference clock, a phase detector 22, a low-pass filter 24, a gain stage 26, a VCO 28 and a divider 29 configured in a loop. The phase detector is a circuit that normally has an output voltage with an average value proportional to the phase difference between the input signal from oscillator 20 and the output of VCO 28. The low-pass filter 24 is used to extract the average value from the output of the phase detector 22. The average value is then amplified and used to drive the VCO 28. The divider 29 transforms the high frequency Vosc into a low frequency V'osc. The negative feedback of the loop results in the output of the VCO 28 being synchronized or locked with the input signal from oscillator 20. In this locked condition, any slight change in the input signal first appears as a change in phase between the input signal and the VCO frequency. The phase shift then acts as an error signal to change the VCO frequency to match the input signal. In other words, the purpose of the phase detector 12 is to produce and output which represents how far the frequency produced in VCO 18 is from that of the input signal. Comparing these frequencies and producing an error signal proportional to their difference allows the VCO frequency to shift and become the same frequency as the input signal.

An alternate to PLL is injection locking which does not require the design of a high frequency phase detector or divider circuitry. The process of injection locking is a fundamental property of oscillators, in that it can be observed in a wide variety of oscillator types with the same qualitative behaviour observed in each case. When a periodic signal is injected into an oscillator (e.g. a VCO) with a free-running frequency $f_0$, by summing it with the state oscillation signal, the oscillator will lock to and track the injected signal frequency over $f_0+/-LBW/2$, where LBW is the locking bandwidth. Within this lock range, the process can be modeled as a true first-order PLL which implies that the loop is unconditionally stable and that the phase noise of the output tracks the phase noise of the injected clock over a wide bandwidth. Moreover, the locking bandwidth (LBW) increases for larger injection amplitudes. For example, to accommodate process and environment variations, typical radio frequency (RF) applications require an LBW of 25–50 MHz greater than the signal bandwidth. However, achieving this LBW typically requires a large injection signal power, which is undesirable in certain applications such as integrated (as opposed to discrete) circuits. Further, given the inherent advantages of digital (as opposed to analogue) signal processing, the ability to determine the oscillation frequency of the VCO using a digital circuit would be advantageous. In particular, in an integrated circuit environment, the ability to eliminate off-chip components and to reduce the overall chip area is desirable.

SUMMARY OF THE INVENTION

In order to overcome the deficiencies of the prior art, an improved injection locking circuit is provided which allows the VCO to injection lock with a smaller LBW and associated lower signal power. By ensuring that the free running oscillator frequency is close to the injection harmonic, independent of process and environmental variation, the required LBW is greatly reduced. As a result, the injection power and associated power dissipation is also reduced. Further, the signal processing capabilities of digital circuits is used to determine the oscillation frequency of the VCO without requiring extensive additional circuitry.

In order to allow the VCO to injection lock with a smaller reference signal and therefore a smaller LBW, this invention includes a pre-tuning algorithm to place the VCO frequency such that the desired frequency is in the desired LBW. Tuning of the VCO is achieved using direct digital tuning that does not require an input reference. Injection locking is performed using a low frequency clock harmonic as the reference signal. The output signal of the VCO is sub-sampled and digitized, the center frequency determined and the VCO control voltage adjusted. The VCO output can be further sub-sampled and digitally tuned so that it is within the LBW of a reference signal.

In accordance with one aspect of the invention there is provided a method of digitally pre-tuning and injection locking a voltage controlled oscillator (VCO) comprising the steps of: digitally pre-tuning the VCO to within a specified locking bandwidth (LBW); injecting an input reference signal into said VCO; and locking said VCO to said input reference signal.

Preferably, the step of digitally pre-tuning comprises the steps of: digitizing the VCO output; determining the VCO output frequency; adjusting the VCO output frequency; and repeating the steps of digitizing, determining and adjusting until a desired oscillation frequency is reached.

In accordance with a second aspect of the invention a circuit for digitally pre-tuning and injection locking a voltage controlled oscillator (VCO) comprising: a reference oscillator for producing a reference input signal; a VCO electrically connected to said reference oscillator; and a feedback circuit electrically connected to said VCO for digitally pre-tuning said VCO and receiving a reference Preferably, the feedback circuit comprises an analogue-to-digital (ADC), microcontroller and a digital-to-analogue converter (DAC), wherein a control signal is produced in the microcontroller and injected into the VCO.

The advantage of the present invention is now readily apparent. A low power oscillator incorporating injection locking with direct digital tuning is provided with improved locking range.

BRIEF DESCRIPTION OF THE DRAWINGS

A better understanding of the invention will be obtained by considering the detailed description below, with reference to the following drawings in which.

DESCRIPTION OF THE PREFERRED EMBODIMENT

Figure 1:
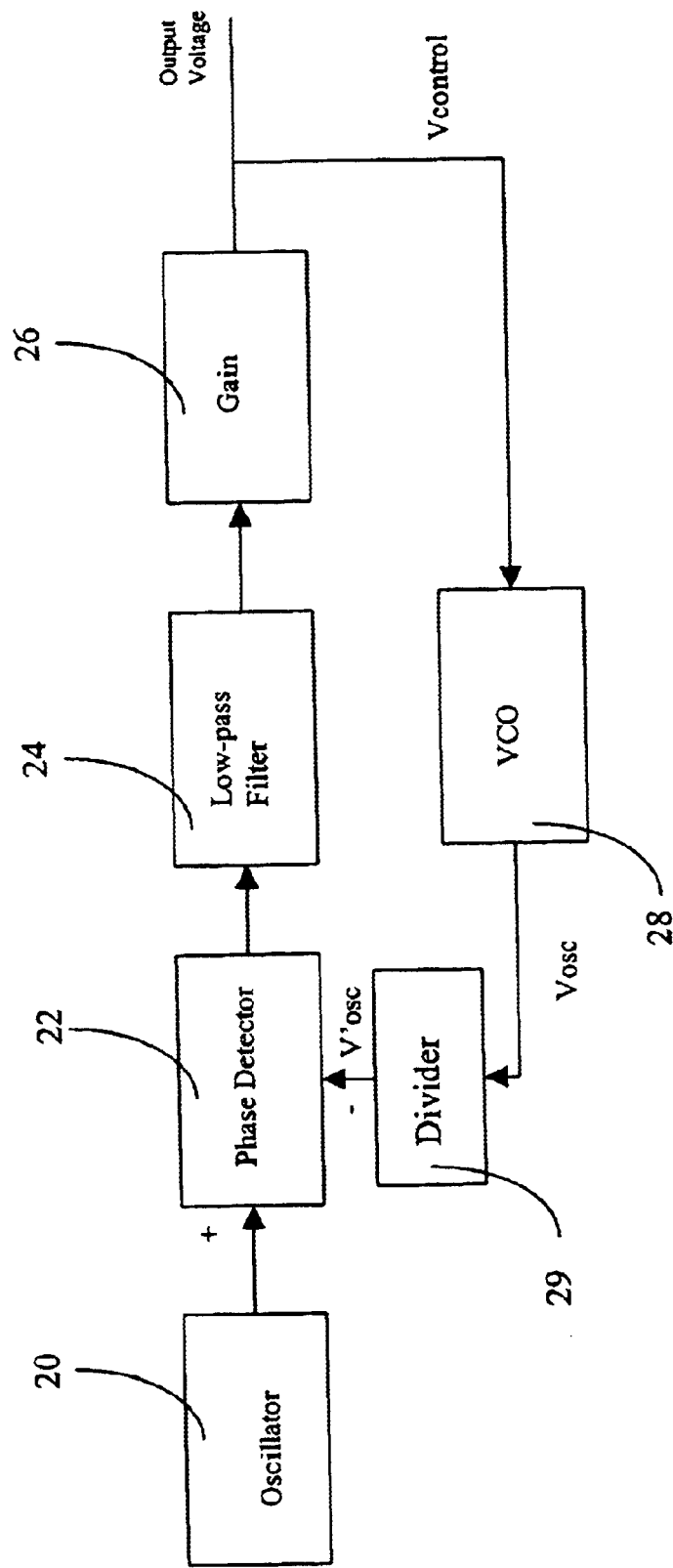
FIG. 1 depicts a block diagram of an oscillator circuit including a PLL with VCO circuit in accordance with the prior art.

The invention may be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout. The accompanying drawings and the description below refer to the preferred embodiment, but is not limited thereto.

The present invention arises from the realization that the signal processing capabilities of digital circuits, such as those commonly employed in radio transceiver circuits, may be used to determine the oscillation frequency of a VCO without requiring extensive additional circuitry.

Figure 2:
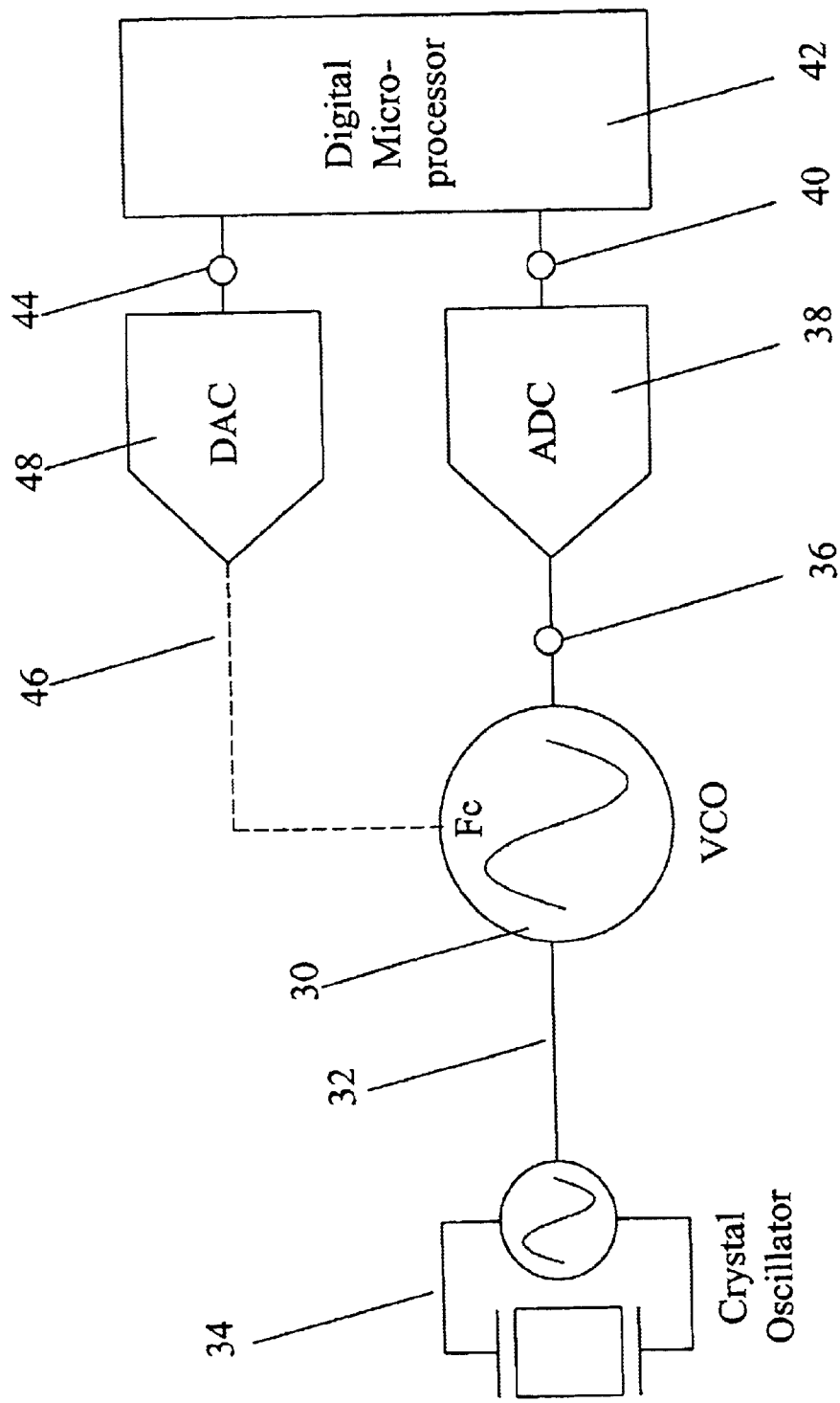
FIG. 2 depicts a block diagram of the VCO tuning and injection locking system in accordance with the present invention.

As shown in FIG. 2, the tuning of the VCO 30 is accomplished in the digital domain and involves three main components: analogue-to-digital converter (ADC) 38, digital microcontroller 42 and digital-to-analogue (DAC) converter 48. To begin, reference signal 32 normally inputted to VCO 30 from the reference crystal oscillator 34 is turned off. Pre-tuning is performed by first sub-sampling VCO output 36 with ADC 38. The sub-sampled signal 40 is then processed in the digital domain using digital microcontroller 42 where the center frequency ($f_c$) of the VCO 30 is determined. As a skilled workman will appreciate, several methods are available for determining $f_c$. For example, $f_c$ can be determined by performing a Fast Fourier Transformation (FFT) of the sampled data, removing the narrow band desired signal and any other interfering signals, smoothing the amplified noise if necessary and finding the peak of the resultant frequency response. A more efficient approach is to replace the FTT with a digital down conversion stage. The resulting phase shift from one sample to the next can be measured to calculate the frequency, $f_c$ of the VCO 30. Once the VCO frequency is determined it is adjusted by generating digital control signals 44 that are converted to analog signals 46 using DAC 48. This feedback process involving the ADC 38, microprocessor 42 and DAC 48 is continuously repeated until the desired VCO frequency is reached.

By pre-tuning VCO 30 so that its oscillation frequency $f_c$ is close to the desired frequency, the required LBW is reduced significantly. A reduction in the LBW reduces the required power of reference signal 32. This allows a lower frequency reference signal with significant higher harmonics to be used as the reference signal. In the preferred embodiment, a low frequency crystal oscillator is used to injection lock an RF VCO with the $N^{th}$ harmonic, where N is the result of dividing the VCO frequency with the fundamental crystal frequency.

Once the VCO 30 is tuned within the LBW, the input to the VCO 30 is turned on, allowing the reference signal 32 to be injected into VCO 30. In the preferred embodiment, the reference signal 32 takes the form of a crystal oscillator 34 whose high frequency harmonics contain one such harmonic at the desired oscillation frequency for the VCO. The VCO is tuned close enough to this desired oscillation frequency to allow injection locking. Once the reference signal is applied, the VCO remains locked to the harmonic of the crystal oscillator.

Figure 3:
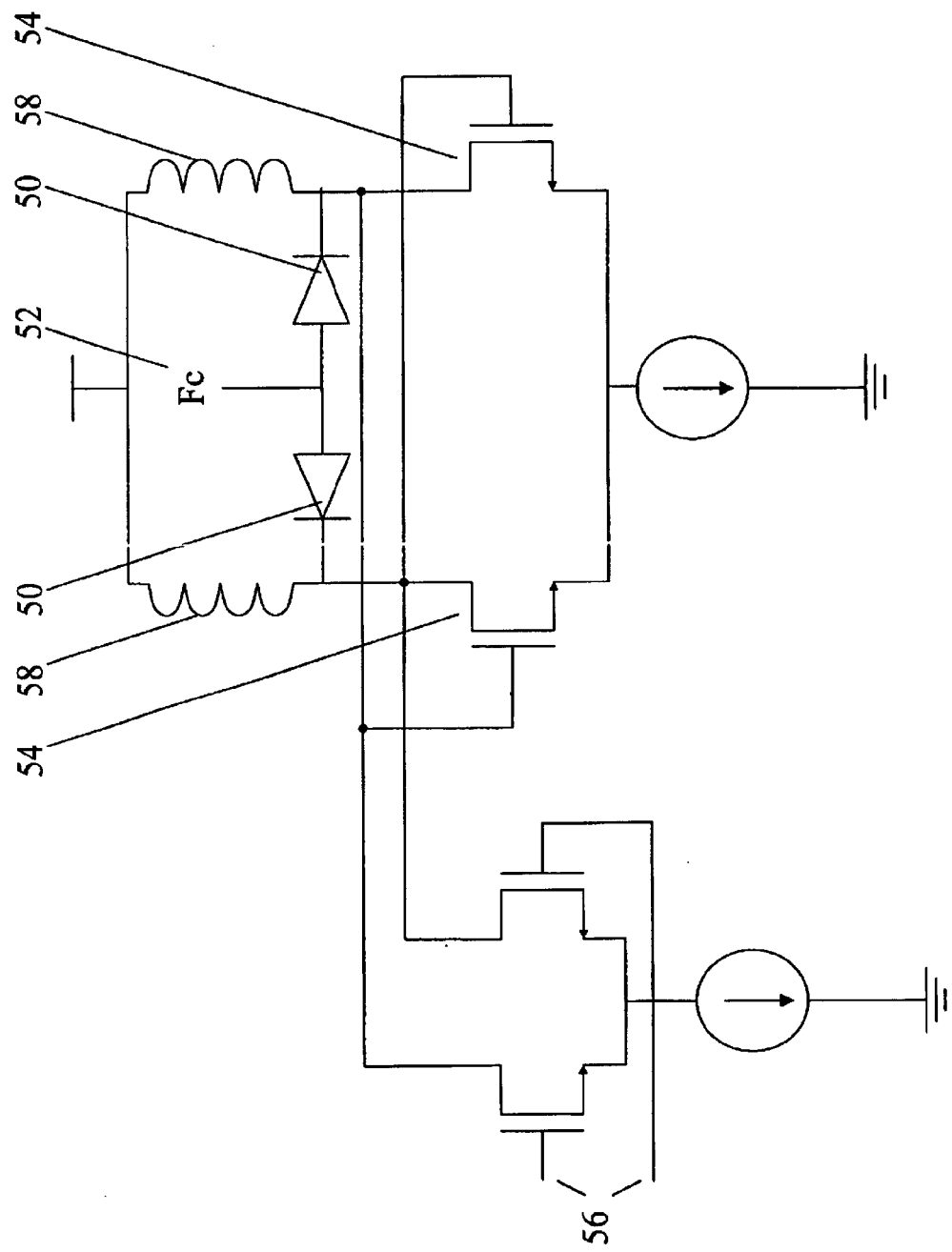
FIG. 3 depicts an example VCO circuit with injection input port in accordance with the present invention.

FIG. 3 depicts a sample circuit diagram used in the preferred embodiment of VCO 30. The tank circuit of the VCO is comprised of inductors 58 and variable capacitors 50. As will be appreciated by those in the art, a tank circuit is a parallel resonator circuit comprised of an inductor, a capacitor and an optional resistor. Since the capacitor and the inductor both store energy, it is commonly referred to as a tank circuit. As will also be appreciated, variable capacitors 50 could be replaced with a set of switched capacitor banks.

Returning to FIG. 3, the variable capacitors 50 have a control voltage 52 that is adjusted by the digital-to-analog converter 48. The losses in the tank circuit are cancelled by the negative impedance created by a differential pair of transistors 54. This creates the condition for oscillation. The input differential pair of transistors 56 converts the input reference to a current. The current is injected into the tank circuit of the VCO 30 (i.e. added to the current signal of the oscillator tank circuit).

Figure 4:
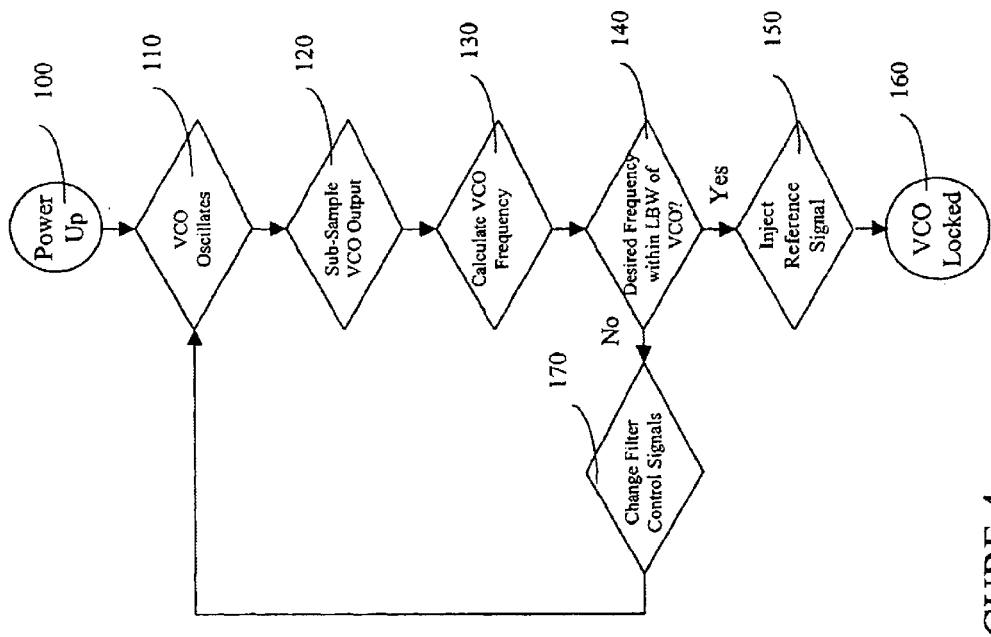
FIG. 4 a flow diagram of the tuning and injection locking process in accordance with the present invention.

FIG. 4 is a flow diagram of the tuning and injection process in operation. When the VCO is initially powered up 100, the VCO oscillates 110 and the output is sub-sampled 120. The oscillation frequency, $f_c$ is determined 130 in the digital domain. Next, a test is performed 140 to see if $f_c$ is within the predetermined LBW range. If $f_c$ is correct then the tuning cycle is complete, the input to the VCO is turned on 150 and the VCO is injection locked to the reference signal 160. If $f_c$ is not correct then the control signal is adjusted 170 and the tuning process is repeated.

The above description of the preferred embodiment utilizes direct digitization of the VCO signal. As will be understood by those skilled in the art, sub-sampling of the VCO output is a good method for digitizing a narrow-band high frequency signal but the step of digitizing could also be accomplished by mixing down to an intermediate frequency (IF) and then digitizing with the ADC by sampling or sub-sampling. This alternate embodiment is also meant to be included within the scope of the invention.

In addition, the preferred embodiment uses digital circuitry to determine the oscillation frequency of the VCO. The present invention is not limited to this embodiment. Other circuits can be construed that would be capable of determining the oscillation frequency of the VCO using analog circuitry. This analog circuitry in turn could be used to adjust the frequency of the VCO until it is within the LBW of the desired signal and the injection locking is then turned on.

Finally, the preferred embodiment uses a microcontroller for processing the sub-sampled VCO output signal within the digital domain. As a workman skilled in the art will appreciate, a microcontroller is usually embedded into some other device (e.g. a radio transceiver) and typically includes: (a) a central processing unit (CPU) that executes software programs; (b) Random Access Memory (RAM); (c) Erasable Programmable Read Only Memory (EPROM); (d) serial and parallel I/O; (e) timers; and (f) an interrupt controller. In the present invention, the processing could be equally accomplished by the use of pure digital circuitry designed to perform the functions described in relation to FIG. 2 (e.g. performing an FFT).

As will be understood by those skilled in the art, the present invention relates to an injection locking circuit incorporating direct digital tuning. The circuit described herein can be produced in discrete or integrated circuit form and may be used in combination with other components to perform a specified analogue or digital function in, for example, a radio transceiver. It is to be understood by the reader that a variety of other implementations may be devised by skilled persons and the claimed invention herein is intended to encompass all such alternative implementations, substitutions and equivalents. Persons skilled in the field of electronic circuit design will be readily able to apply the present invention to an appropriate implementation for a given application. For example, other types of VCOs or tuning algorithms could be used.

A person understanding this invention may now conceive of alternative structures and embodiments or variations of the above all of which are intended to fall within the scope of the invention as defined in the claims that follow.

We claim:

1. A method of digitally pre-tuning and injection locking a voltage controlled oscillator (VCO) having an output of a specified frequency, said method comprising the steps of:

(a) digitally pre-tuning said VCO to within a specified locking bandwidth (LBW);

(b) injecting an input reference signal into said VCO; and (c) locking said VCO to said input reference signal, wherein the step of digitally pre-tuning comprises the steps of:
   (i) digitizing said VCO output;
   (ii) determining said VCO output frequency;
   (iii) adjusting said VCO output frequency; and
   (iv) repeating steps (a) to (c) until a desired oscillation frequency is reached.

2. The method of claim 1 wherein the step of determining further comprises the step of calculating a center frequency ($f_c$) associated with said VCO with a microcontroller.

3. The method of claim 2 wherein the step of determining further comprises the step of determining if said calculated center frequency ($f_c$) is within a desired locking bandwidth (LBW).

4. The method of claim 3 wherein the step of digitizing further comprises the step of sub-sampling said VCO output with an analogue-to-digital converter (ADC).

5. The method of claim 4 wherein the step of calculating further comprises the step of performing a Fast Fourier Transformation (FFT) with said microcontroller on said sub-sampled VCO output.

6. The method of claim 5 wherein the step of calculating further comprises the step of removing any interference from said VCO output.

7. The method of claim 6 wherein the step of adjusting further includes the step of generating digital control signals with said microcontroller.

8. The method of claim 7 wherein the step of adjusting further includes the step of converting said digital control signals to analogue signals with a digital-to-analogue converter (DAC).

9. The method of claim 1 wherein the step of digitizing further comprises the step of sampling a varying intermediate frequency (IF).

10. The method according to claim 1 wherein said step of injecting comprises injecting the Nth harmonic of a low frequency crystal oscillator.

11. The method of claim 10 wherein the step of locking further comprises the step of locking to said Nth harmonic.

12. The method of claim 4 wherein the step of calculating further comprises the step of performing a digital down conversion of said sub-sampled VCO output.

13. The method of claim 12 wherein the step of calculating further comprises measuring the phase shift between each sample of said sub-sampled VCO output.

14. The method of claim 1 wherein the step of determining further comprises the step of calculating a center frequency ($f_c$) associated with said VCO using digital circuitry.

15. A circuit for digitally pre-tuning and injection locking a voltage controlled oscillator (VCO) comprising:

(a) a reference oscillator for producing a low frequency clock harmonic;

(b) a VCO electrically connected to said reference oscillator; and (c) a feedback circuit electrically connected to said VCO for digitally pre-tuning said VCO prior to receipt of said low frequency clock harmonic by said VCO.

16. The circuit of claim 15 wherein said reference oscillator is a low frequency crystal oscillator.

17. The circuit of claim 15 wherein said circuit is a radio transceiver circuit.

18. The circuit of claim 15 wherein said feedback circuit comprises an analogue-to-digital converter (ADC), a microcontroller and a digital-to-analogue converter (DAC), and wherein a control signal is produced in said microcontroller and sent to said VCO.

19. The circuit of claim 18 wherein said VCO is a radio frequency (RF) VCO.

20. The circuit of claim 19 wherein said RF VCO further comprises a tank circuit.

21. The circuit of claim 20 wherein said tank circuit comprises at least two variable capacitors having an associated control voltage, and wherein said control voltage is adjusted by said DAC.

22. The circuit of claim 20 wherein said tank circuit comprises a set of switched capacitor banks having an associated control voltage, and wherein said control voltage is adjusted by said DAC.

23. The circuit of claim 21 wherein said tank circuit is electrically connected to a first pair of differential transistors having a negative impedance associated therewith, and wherein said negative impedance serves to cancel any electrical losses associated with said tank circuit.

24. The circuit of claim 23 wherein said tank circuit in combination with said first pair of differential transistors form an oscillator.

25. The circuit of claim 21 wherein said tank circuit is electrically connected to a second pair of differential transistors for converting said reference input signal to a current, and wherein said current is injected into said tank circuit.

26. The circuit of claim 25 wherein said current is added to a current signal associated with said tank circuit.

27. The circuit of claim 15 wherein said feedback circuit comprises an analogue-to-digital converter (ADC), digital circuitry and a digital-to-analogue converter (DAC), and wherein a control signal is produced in said digital circuitry and sent to said VCO.

* * * * *

UNITED STATES PATENT AND TRADEMARK OFFICE
CERTIFICATE OF CORRECTION

PATENT NO. : 6,963,249 B2  
APPLICATION NO. : 10/639543  
DATED : November 8, 2005  
INVENTOR(S) : Christopher Andrew Devries et al.

Page 1 of 1

It is certified that error appears in the above-identified patent and that said Letters Patent is hereby corrected as shown below:

Col. 6, line 6 should read:  
(iv) repeating steps (i) to (iii) until a desired oscillation Signed and Sealed this Seventeenth Day of March, 2009

JOHN DOLL  
*Acting Director of the United States Patent and Trademark Office*